(12) United States Patent
Beer et al.

(10) Patent No.: US 8,031,473 B2
(45) Date of Patent: Oct. 4, 2011

(54) CONTROL DEVICE AND METHOD FOR PRODUCING A CONTROL DEVICE

(75) Inventors: Stefan Beer, Laaber (DE); Josef Loibl, Bad Abbach (DE); Hermann-Josef Robin, Regensburg (DE); Karl Smirra, Wasserburg (DE)

(73) Assignee: Continental Automotive GmbH, Hannover (DE)

( * ) Notice: Subject to any disclaimer, the term of this patent is extended or adjusted under 35 U.S.C. 154(b) by 696 days.

(21) Appl. No.: 12/172,638

(22) Filed: Jul. 14, 2008

(65) Prior Publication Data

US 2009/0016034 A1     Jan. 15, 2009

(30) Foreign Application Priority Data

Jul. 12, 2007 (DE) .......................... 10 2007 032 594

(51) Int. Cl.
*H05K 7/00* (2006.01)
*H05K 3/30* (2006.01)

(52) U.S. Cl. ........ 361/760; 361/736; 361/737; 361/749; 361/752; 174/266; 174/520; 174/528; 257/668; 257/724; 257/697; 257/678; 340/429; 340/436; 29/840; 29/841; 29/856

(58) Field of Classification Search .......... 361/714–724, 361/736–738, 749, 752, 756, 760–767, 800, 361/807, 819; 257/667, 668, 678, 697–699, 257/683, 787, 724, 729, 700; 174/262, 266, 174/59, 377, 535, 520, 528, 544, 551, 564; 29/831, 840–842, 846, 856, 857; 340/429, 340/436, 665; 439/370, 198, 913, 519, 521, 439/140, 487; 326/47, 101; 318/139, 254, 318/256, 280, 287, 293

See application file for complete search history.

(56) References Cited

U.S. PATENT DOCUMENTS

| 4,072,378 | A | * | 2/1978 | Lochbrunner et al. | ........ 439/370 |
| 4,893,215 | A | * | 1/1990 | Urushiwara et al. | .......... 361/739 |
| 5,208,728 | A | * | 5/1993 | Schirmer | ...................... 361/752 |
| 5,392,197 | A | * | 2/1995 | Cuntz et al. | .................... 361/818 |
| 5,519,252 | A | | 5/1996 | Soyano et al. | |
| 5,679,978 | A | * | 10/1997 | Kawahara et al. | ............. 257/697 |
| 6,028,770 | A | * | 2/2000 | Kerner et al. | ................. 361/704 |
| 6,052,893 | A | | 4/2000 | Yoshida et al. | |
| 6,157,544 | A | * | 12/2000 | Ferling et al. | ................. 361/800 |
| 6,160,708 | A | * | 12/2000 | Loibl et al. | ..................... 361/704 |
| 6,180,880 | B1 | * | 1/2001 | Loibl et al. | ..................... 174/541 |
| 6,181,574 | B1 | * | 1/2001 | Loibl | ............................ 361/816 |

(Continued)

FOREIGN PATENT DOCUMENTS

DE    19907949 A1    9/2000

(Continued)

*Primary Examiner* — Michail V Datskovskiy

(74) *Attorney, Agent, or Firm* — Laurence A. Greenberg; Werner H. Stemer; Ralph E. Locher

(57) ABSTRACT

A control device has a base plate, a cover plate coupled to the base plate, a cavity formed between the base plate and the cover plate, a circuit carrier disposed in the cavity, and a conducting track carrier electrically coupled to the circuit carrier. The base plate has a continuous recess that is configured and arranged for feeding a casting compound into the cavity between the base plate and the cover plate. The casting compound is embodied to at least partly enclose the circuit carrier and/or the conducting track carrier in a vibration-damping manner.

6 Claims, 1 Drawing Sheet

U.S. PATENT DOCUMENTS

| | | | | |
|---|---|---|---|---|
| 6,184,464 B1 * | 2/2001 | Liptak et al. | | 174/521 |
| 6,219,247 B1 * | 4/2001 | Haupt et al. | | 361/707 |
| 6,300,565 B1 * | 10/2001 | Loibl et al. | | 174/520 |
| 6,350,953 B1 * | 2/2002 | Franzen | | 174/528 |
| 6,362,964 B1 * | 3/2002 | Dubhashi et al. | | 361/707 |
| 6,379,997 B1 * | 4/2002 | Kawahara et al. | | 438/106 |
| 6,570,773 B1 * | 5/2003 | Loibl et al. | | 361/752 |
| 6,586,105 B2 * | 7/2003 | Eguchi et al. | | 428/447 |
| 6,590,777 B2 * | 7/2003 | Morino et al. | | 361/736 |
| 6,652,312 B2 * | 11/2003 | Liegl et al. | | 439/519 |
| 7,080,575 B2 * | 7/2006 | Jungbauer et al. | | 74/606 R |
| 7,116,215 B2 * | 10/2006 | Oonishi | | 340/436 |
| 7,193,852 B2 * | 3/2007 | Wetzel | | 361/714 |
| 7,656,674 B2 * | 2/2010 | Wetzel et al. | | 361/752 |
| 7,859,852 B2 * | 12/2010 | Wetzel et al. | | 361/749 |

FOREIGN PATENT DOCUMENTS

EP 0591631 A1 4/1994

* cited by examiner

CONTROL DEVICE AND METHOD FOR PRODUCING A CONTROL DEVICE

CROSS-REFERENCE TO RELATED APPLICATION

This application claims the priority, under 35 U.S.C. §119, of German application DE 10 2007 032 594.2, filed Jul. 12, 2007; the prior application is herewith incorporated by reference in its entirety.

BACKGROUND OF THE INVENTION

Field of the Invention

The invention relates to a control device and to a method for producing a control device.

There is an increasing demand for motor vehicles to be provided with control electronics and the associated sensors integrated in an automatic transmission. This type of integration is also increasingly desirable in engine management and in braking system control. Conducting track carriers or flexible printed circuits are thus frequently used in the mechatronic systems employed for this purpose. For reasons of economy these conducting track carriers are in the form of single-layer printed circuit boards. The control electronics mounted on a circuit carrier are electrically coupled to the conducting track carrier. The circuit carrier must be shielded against oils used in the engines and gearboxes, since these oils contain chemically extremely aggressive additives. At the same time, however, electric leads have to be routed through the shielding so that components of an engine or a gearbox can be electronically controlled. The technological system requirements are, in particular, for leakproofness with respect to the surrounding media (oil, gasoline, water), for operating capability over a wide temperature range (−40° C. to +140° C.), and for resistance to vibration accelerations.

Published, non-prosecuted German patent application DE 199 07 949 A1, corresponding to U.S. Pat. No. 6,570,773 B1, discloses a populated assembly for a motor vehicle, which assembly has a base plate, a substrate which is mounted on the base plate and is populated with electrical components, and a conducting track carrier which is routed to the substrate and which establishes electrical contact with the populated substrate by conductor wires attached to the conducting track carrier at appropriate contact points. The assembly is provided with potting structures formed from a casting compound over the substrate and over the points of contact between the wires and the conducting track carrier.

SUMMARY OF THE INVENTION

It is accordingly an object of the invention to provide a control device and a method for producing a control device which overcome the above-mentioned disadvantages of the prior art devices and methods of this general type, each of which allows the circuit carrier to be electrically connected to the conducting track carrier in a cost-effective and mechanically secure manner.

According to a first aspect, the invention is distinguished by a control device having a base plate, a cover plate coupled to the base plate, a cavity formed between the base plate and the cover plate, a circuit carrier which is disposed in the cavity, and a conducting track carrier which is electrically coupled to the circuit carrier. The base plate has a continuous recess that is configured and disposed for feeding a casting compound into the cavity between the base plate and the cover plate. The casting compound is configured to at least partly enclose the circuit carrier and/or the conducting track carrier in a vibration-damping manner.

The advantage of this is that the casting compound can also be inserted from the base plate side. Thus, instead of the casting compound being fed in via the cover plate, as is otherwise usually the case, it can be fed in via the base plate, in particular if the cover plate is not suitable for feeding in the casting compound.

In a preferred embodiment of the invention, there is disposed in the continuous recess of the base plate a sealing element by which the cavity can be sealed in a fluid-tight manner. This is advantageous since, in this way, the cavity of the control device can be outwardly sealed off in a fluid-tight manner, in particular if the casting compound is, in its end state, disposed gravitationally above the continuous recess of the base plate.

In a further preferred embodiment, the conducting track carrier is a flexible printed circuit board. The advantage of this is that the shielding for controllers, for example transmission controls, engine management systems, etc., can be used in conjunction with flexible printed circuit boards.

In a further preferred embodiment of the invention, the cover plate is embodied as a deep-drawn metal sheet. This is advantageous since, in this way, a tried and tested and cost-effective method can be used to produce the cover plate. Furthermore, this results in that just a small amount of material is required for the cover plate.

In a further preferred embodiment of the invention, the cover plate has a thickness of 0.4 to 0.8 mm. The advantage of this is that the cover plate can be produced with a very small amount of material.

According to a second aspect, the invention is distinguished by a method for potting a circuit carrier of a control device. The control device has a base plate having a continuous recess, a cover plate coupled to the base plate, a cavity formed between the base plate and the cover plate, a circuit carrier which is disposed in the cavity and is coupled to the base plate, and a conducting track carrier which is electrically coupled to the circuit carrier. The method has the following steps: readying the control device; feeding a casting compound into the cavity between the base plate and the cover plate via the continuous recess in the base plate; sealing the continuous recess in the base plate in a fluid-tight manner by a sealing element; prior to the solidification of the casting compound in the cavity, aligning the control device such that the circuit carrier is disposed gravitationally above the base plate.

The advantage of this method is that potting of the circuit carrier side and/or conducting track carrier side further from the base plate is also possible for a continuous recess in the base plate. This method can thus also be carried out if the cover plate is not suitable for feeding in the casting compound, for example because the cover plate is not intended to have a continuous recess.

Other features which are considered as characteristic for the invention are set forth in the appended claims.

Although the invention is illustrated and described herein as embodied in a control device and a method for producing a control device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages

DETAILED DESCRIPTION OF THE INVENTION

Figure 1:
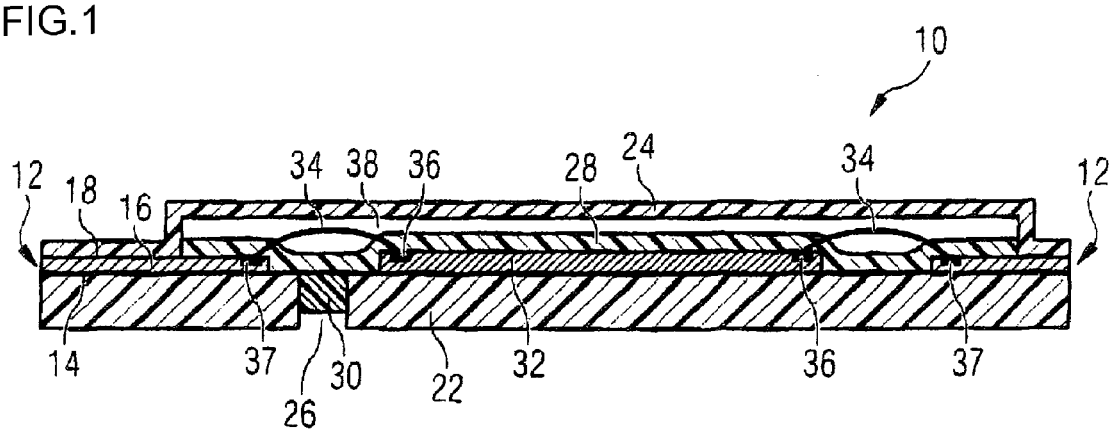
FIG. 1 is a diagrammatic sectional view of a control device according to the invention.
Figure 2:
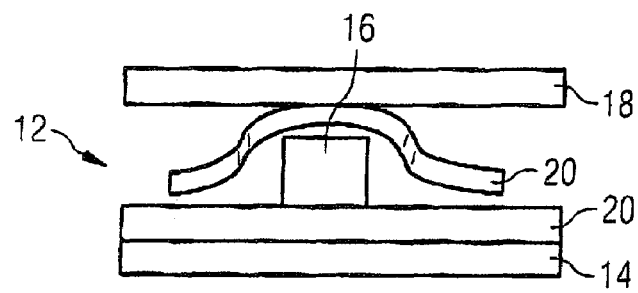
FIG. 2 is a diagrammatic sectional view of a conducting track carrier.

Components having the same design or the same function are indicated by the same reference numbers in each of the figures. Referring now to the figures of the drawing in detail and first, particularly, to FIGS. 1 and 2 thereof, there is shown a structure of a control device 10 and of a conducting track carrier 12. The control device 10 has a base plate 22, on which is disposed the conducting track carrier 12. The conducting track carrier 12 is preferably a flexible printed circuit board. In this case the conducting track carrier 12 has a base film 14 and a cover film 18, between which are disposed one or more conducting tracks 16, which are preferably made from copper. The conducting track 16 is embedded in various films of adhesive 20 disposed between the base film 14 and the conducting track 16 on the one side and between the conducting track 16 and the cover film 18 on the other side. Both the base film 14 and the cover film 18 are flexible and are preferably made from polyimide, which has the chemical, thermal and mechanical properties required for use in vehicle components.

Figure 3:
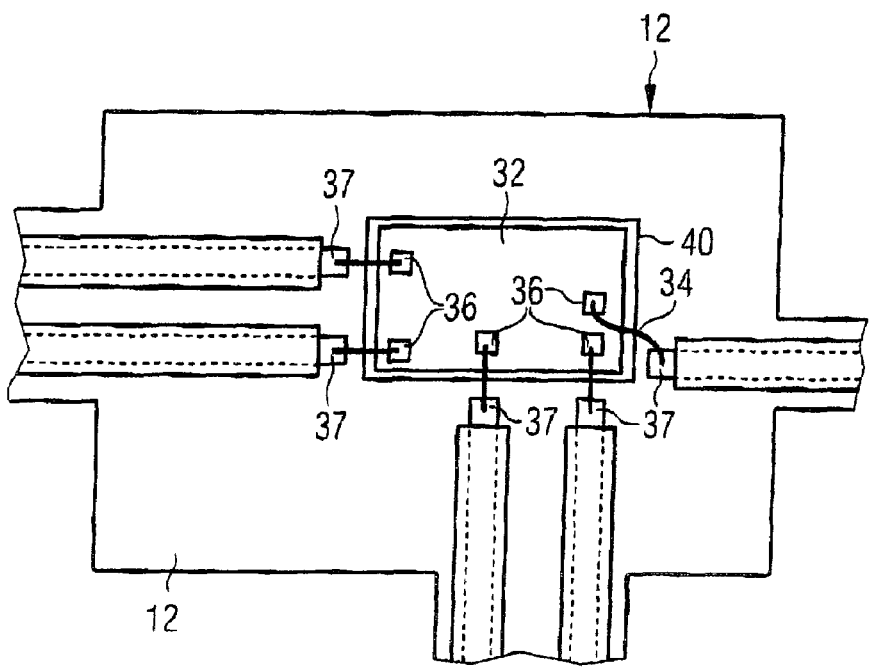
FIG. 3 is a diagrammatic plan view of the conducting track carrier and of a circuit carrier of the control device.

In an opening 40 of the conducting track carrier 12 there is also disposed, on the base plate 22, a circuit carrier 32 (FIG. 3). The circuit carrier 32 can either rest on the base plate 22 or be fixedly coupled thereto, preferably adhesively affixed thereon. The circuit carrier 32 is preferably a low temperature co-fired ceramic (LTCC) substrate.

The circuit carrier 32 is populated with electrical and/or electronic components and has electrically conductive contact points or pads 36. The conducting track carrier 12 likewise has electrically conductive contact points or pads 37. The electrically conductive contact points 36 of the circuit carrier 32 and the electrically conductive contact points 37 of the conducting track carrier 12 are electrically intercoupled by connecting wires 34. The connecting wires 34 are preferably bonding wires, and heavy aluminum bonding wires with a thickness of approximately 300 μm are particularly preferred.

Disposed on the conducting track carrier 12 is a cover plate 24 that is coupled to the base plate 22. Between the base plate 22 and the cover plate 24 there is formed a cavity 38 in which is disposed the circuit carrier 32. Parts of the conducting track carrier 12 are also disposed in the cavity 38.

The cover plate 24 is coupled to the base plate 22 in an oil-tight manner by a pressure connection. Between the base plate 22 and the cover plate 24 the conducting track carrier 12 is routed out of the cavity 38 between the base plate 22 and the cover plate 24 and, outside the cavity 38, is contacted with electrical or electronic components.

A casting compound 28 is applied to the circuit carrier 32 and the conducting track carrier 12. The casting compound 28 is preferably a SilGel. A SilGel is a gel with a high silicone content; it is runny and therefore spreads out well. The casting compound 28 enables the circuit carrier 32 and the conducting track carrier 12 to be enclosed in a vibration-damping manner.

The base plate 22 has a continuous recess 26 via which the casting compound 28 can be fed in and which is sealed in a fluid-tight manner with a sealing element 30, in particular after the casting compound 28 has been fed in. The sealing element 30 can be a machine element that fits into the continuous recess 26, for example a screw, a ball or a tapered piece. The base plate 22 preferably has only one continuous recess 26. In this case the casting compound 28 can be particularly easily handled during the potting process.

The cover plate 24 is preferably embodied as a deep-drawn metal sheet, since metal sheets of this kind are easy to produce and only a small amount of material is required for the cover plate 24. The cover plate 24 preferably has a thickness of 0.4 to 0.8, with a thickness of approximately 0.6 mm being particularly preferred. Thus it is possible to produce the cover plate 24 using a very small amount of material. Furthermore, deep-drawn metal sheets allow a much higher material output from the tool.

The method for potting the circuit carrier 32 of the control device 10 will be explained in detail below.

In a first step, the control device 10 is readied. In a second step, the casting compound 28 is fed to the cavity 38 between the base plate 22 and the cover plate 24 via the continuous recess 26 in the base plate 22. In a further step, the continuous recess 26 is sealed in a fluid-tight manner by the sealing element 30 in the base plate 22. Thus the continuous recess 26 is sealed in both an oil-tight and a SilGel-tight manner.

In a further step, prior to the solidification of the casting compound in the cavity 38, the control device 10 is aligned such that the circuit carrier 32 is disposed gravitationally above the base plate 22. Therefore the sides of the circuit carrier 32 and of the conducting track carrier 12 further from the base plate 22 are disposed gravitationally above the base plate 22 and can thus be enclosed by the casting compound 28 on these sides. It is thus possible for the casting compound 28 to be formed both on the circuit carrier 32 and on the conducting track carrier 12 such that the circuit carrier 32 and/or the conducting track carrier 12 are or is enclosed by the casting compound 28 in a vibration-damping manner. Likewise, the connecting wires 34, which establish the electrical coupling between the contact points 36 on the circuit carrier 32 and the contact points 37 on the conducting track carrier 12, are wholly or partly embedded in the casting compound 28.

This method makes it possible for the circuit carrier 32 and/or the conducting track carrier 12 also to be potted via a continuous recess 26 in the base plate 22.

The invention claimed is:

1. A control device, comprising:
   a base plate;
   a cover plate coupled to said base plate, said base plate and said cover plate defining a cavity formed there between;
   a circuit carrier disposed in said cavity;
   a conducting track carrier electrically coupled to said circuit carrier;
   a casting compound; and
   said base plate having a continuous recess formed therein configured and disposed for feeding said casting compound into said cavity between said base plate and said cover plate, said casting compound configured to at least partly enclose at least one of said circuit carrier and said conducting track carrier in a vibration-damping manner.

2. The control device according to claim 1, further comprising a sealing element disposed in said continuous recess of said base plate, said sealing element sealing said cavity in a fluid-tight manner.

3. The control device according to claim 1, wherein said conducting track carrier is a flexible printed circuit board.

4. The control device according to claim 1, wherein said cover plate is formed from a deep-drawn metal sheet.

5. The control device according to claim 4, wherein said cover plate has a thickness of 0.4 to 0.8 mm.

6. A method for potting a circuit carrier of a control device, the control device having a base plate with a continuous recess formed therein, a cover plate coupled to the base plate, a cavity formed between the base plate and the cover plate, a circuit carrier disposed in the cavity and coupled to the base plate, and a conducting track carrier electrically coupled to the circuit carrier, the method comprises the steps of:

provinding the control device;

feeding a casting compound into the cavity between the base plate and the cover plate via the continuous recess in the base plate;

sealing the continuous recess in the base plate in a fluid-tight manner with a sealing element; and aligning the control device such that the circuit carrier is disposed gravitationally above the base plate prior to a solidification of the casting compound in the cavity.

* * * * *